United States Patent
Xu et al.

(10) Patent No.: US 9,323,143 B2
(45) Date of Patent: Apr. 26, 2016

(54) CONTROLLING TEMPLATE SURFACE COMPOSITION IN NANO-IMPRINT LITHOGRAPHY

(75) Inventors: Frank Y. Xu, Round Rock, TX (US); Weijun Liu, Cedar Park, TX (US)

(73) Assignees: Canon Nanotechnologies, Inc., Austin, TX (US); Molecular Imprints, Inc., Austin, TX (US)

(*) Notice: Subject to any disclaimer, the term of this patent is extended or adjusted under 35 U.S.C. 154(b) by 1275 days.

(21) Appl. No.: 12/364,979

(22) Filed: Feb. 3, 2009

(65) Prior Publication Data

US 2009/0197057 A1    Aug. 6, 2009

Related U.S. Application Data

(60) Provisional application No. 61/026,161, filed on Feb. 5, 2008.

(51) Int. Cl.
*B82Y 10/00*    (2011.01)
*B82Y 40/00*    (2011.01)
*G03F 7/00*    (2006.01)

(52) U.S. Cl.
CPC ............... *G03F 7/0002* (2013.01); *B82Y 10/00* (2013.01); *B82Y 40/00* (2013.01); *Y10T 428/24802* (2015.01)

(58) Field of Classification Search
USPC ........................................................ 427/387
See application file for complete search history.

(56) References Cited

U.S. PATENT DOCUMENTS

| | | | |
|---|---|---|---|
| 6,696,220 B2 | 2/2004 | Bailey et al. | |
| 6,719,915 B2 | 4/2004 | Willson et al. | |
| 7,307,118 B2 | 12/2007 | Xu et al. | |
| 7,309,225 B2 | 12/2007 | McMackin et al. | |
| 7,365,103 B2 | 4/2008 | Willson et al. | |
| 2002/0094496 A1* | 7/2002 | Choi et al. | 430/322 |
| 2003/0235787 A1 | 12/2003 | Watts et al. | |
| 2004/0007799 A1* | 1/2004 | Choi et al. | 264/494 |
| 2004/0168613 A1 | 9/2004 | Nguyen et al. | |
| 2004/0191639 A1 | 9/2004 | Jin et al. | |
| 2004/0256764 A1* | 12/2004 | Choi et al. | 264/293 |

(Continued)

FOREIGN PATENT DOCUMENTS

| | | |
|---|---|---|
| TW | I252520 | 4/2006 |
| TW | I263870 | 10/2006 |
| TW | 200602406 | 5/2010 |

OTHER PUBLICATIONS

Sugimura et al., Degradation of a Trimethylsilyl Monolayer on Silicon Substrate Induced by Scanning Probe Anodization, Langmuir, 1995, 11, 3623-3625.*

(Continued)

*Primary Examiner* — Francisco Tschen
(74) *Attorney, Agent, or Firm* — Heather L. Flanagan; Cameron A. King

(57) ABSTRACT

A nano-imprint lithography process includes forming a multiplicity of hydroxyl groups on a surface of a substantially inorganic nano-imprint lithography template, heating the template, and reacting a pre-selected percentage of the hydroxyl groups on the surface of the template with a monofunctional, non-fluorinated compound to form a monolayer coating on the surface of the nano-imprint lithography template. The coated template may be contacted with a polymerizable composition disposed on a nano-imprint lithography substrate, and the polymerizable composition solidified to form a patterned layer. The coated template is separated from the patterned layer.

12 Claims, 4 Drawing Sheets

(56) References Cited

U.S. PATENT DOCUMENTS

| | | |
|---|---|---|
| 2005/0098534 A1 | 5/2005 | Sreenivasan et al. |
| 2005/0160934 A1 | 7/2005 | Xu et al. |
| 2005/0187339 A1 | 8/2005 | Xu et al. |
| 2006/0062922 A1 | 3/2006 | Xu et al. |
| 2006/0108710 A1 | 5/2006 | Xu et al. |
| 2006/0145398 A1 | 7/2006 | Bailey et al. |
| 2006/0175736 A1 | 8/2006 | Xu et al. |
| 2006/0279024 A1 | 12/2006 | Choi et al. |
| 2007/0017631 A1 | 1/2007 | Xu |
| 2007/0021520 A1 | 1/2007 | Xu |
| 2007/0212494 A1 | 9/2007 | Xu et al. |
| 2007/0272825 A1 | 11/2007 | Xu et al. |
| 2008/0110557 A1 | 5/2008 | Xu |
| 2008/0160129 A1 | 7/2008 | Resnick et al. |
| 2008/0303187 A1* | 12/2008 | Stacey et al. .................. 264/293 |
| 2011/0146568 A1* | 6/2011 | Haukka et al. ................ 118/200 |

OTHER PUBLICATIONS

Duchet et al., Grafting of alkylchlorosilanes onto silica from solution for adhesion enhancement, J. Adhesion Sci. Technol. vol. 14, No. 5 pp. 691-715 May 1, 2000.

Tripp et al., Reaction of methysilanols with hydarated silica surfaces: the hydrlysis of trichloro-, dichloro-, and monochloromethylsilanes and the effects of curing, Langmuir, vol. 11, No. 1, pp. 149-155 Nov. 1, 1995.

Duchet, Jannick et al.; "Grafting of alkylchlorosilanes onto silica from solution for adhesion enhancement;" J. Adhesion Sci. Technol., vol. 14, No. 5, pp. 691-718, 2000.

Tripp, C.J. et al.; "Reaction of Methylsilanols with hydrated silica surfaces: The hydrolysis of trichloro-, dichloro-, and monochloromethysilanes and the effects of curing;" Langmuir, vol. 11, No. 1, pp. 149-155, 1995.

* cited by examiner

CONTROLLING TEMPLATE SURFACE COMPOSITION IN NANO-IMPRINT LITHOGRAPHY

CROSS-REFERENCE TO RELATED APPLICATIONS

This application claims the benefit under 35 U.S.C. §119(e)(1) of U.S. provisional application Ser. No. 61/026,161, filed Feb. 5, 2008, which is incorporated by reference herein in its entirety.

STATEMENT REGARDING FEDERALLY SPONSORED RESEARCH OR DEVELOPMENT

The United States government has a paid-up license in this invention and the right in limited circumstance to require the patent owner to license other on reasonable terms as provided by the terms of 70NANB4H3012 awarded by National Institute of Standards (NIST) ATP Award.

TECHNICAL FIELD

The field of the invention relates generally to nano-fabrication of structures.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Application Publication No. 2004/0065976, U.S. Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and the formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

To achieve better adhesion to the substrate of the solidified layer and better release of the solidified layer from a patterning surface of the template, the substrate, the template, or both may be treated before an imprinting process. For example, hexamethyldisilazane (HMDS) has been used as an adhesion promoter for silicon and other types of wafers in the semiconductor industry.

SUMMARY

In one aspect, a nano-imprint lithography method includes forming a multiplicity of hydroxyl groups on a surface of a substantially inorganic nano-imprint lithography template, wherein the hydroxyl groups are bonded to atoms on the surface of the template, heating the template, and reacting a pre-selected percentage of the hydroxyl groups on the surface of the template with a mono-functional, non-fluorinated compound to form a monolayer coating on the surface of the nano-imprint lithography template.

In another aspect, a nano-imprint lithography method includes disposing a polymerizable composition on a nano-imprint lithography substrate, contacting the polymerizable composition with a patterning surface of a nano-imprint lithography template, solidifying the polymerizable composition to form a patterned layer, and separating the coated nano-imprint lithography template from the patterned layer. The patterning surface includes a pre-selected percentage of hydroxyl groups bonded to the surface of the template and a non-fluorinated, silicon-containing monolayer coating formed by reacting a mono-functional, non-fluorinated compound with hydroxyl groups on the patterning surface.

In another aspect, a nano-imprint lithography template includes a patterning surface on the nano-imprint lithography template, and a silicon-containing, non-fluorinated monolayer coating formed on the patterning surface of the nano-imprint lithography template. The monolayer coating is formed by reacting a mono-functional, non-fluorinated compound with a pre-selected percentage of hydroxyl groups on the surface of the template.

In some implementations, the nano-imprint lithography template comprises silicon. The hydroxyl groups may be bonded to silicon atoms on the surface of the nano-imprint lithography template. In some cases, the monolayer coating is a silyl coating. The mono-functional, non-fluorinated compound may include silicon. In some cases, the mono-functional, non-fluorinated compound is a silane. The mono-functional, non-fluorinated compound may be formed by decomposition of hexamethyldisilazane. In some cases, the mono-functional, non-fluorinated compound includes a trimethylsilyl group. The monolayer is not crosslinked and does not form multi-layer or networked structures.

In some implementations, reacting the pre-selected percentage of the hydroxyl groups on the surface of the template with the mono-functional, non-fluorinated compound to form a monolayer coating on the surface of the template includes bonding a trimethylsilyl group to the surface of the template. The pre-selected percentage may from about 5% to about 90%, or from about 20% to about 70%.

In some implementations, a nano-imprint lithography template with a pre-selected percentage of hydroxyl groups on the surface of the template and a non-fluorinated monolayer coating may be contacted with a polymerizable composition including at most about 0.3 wt %, at most about 0.2 wt %, or at most about 0.1 wt % of a surfactant.

In some cases, severed bonds in the monolayer coating react with moisture in situ to form hydroxyl groups on the surface of the template, and the hydroxyl groups interact with surfactant in contact with the surface to maintain release performance over time. The monolayer coating provides reduced friction between the template surface and a polymerizable composition.

In some implementations, the coated nano-imprint lithography template is contacted with a polymerizable composition substantially free of surfactant. In certain implementations, the coated nano-imprint lithography template is contacted with a surfactant-containing composition. The monolayer coating may be about 1 nm thick. The monolayer coating may be substantially unreactive.

In some implementations, the nano-imprint lithography substrate includes an adhesion layer, and a polymerizable composition is disposed on the adhesion layer. The patterning surface may be contacted with a surfactant-containing composition before contacting the polymerizable composition with the patterning surface.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
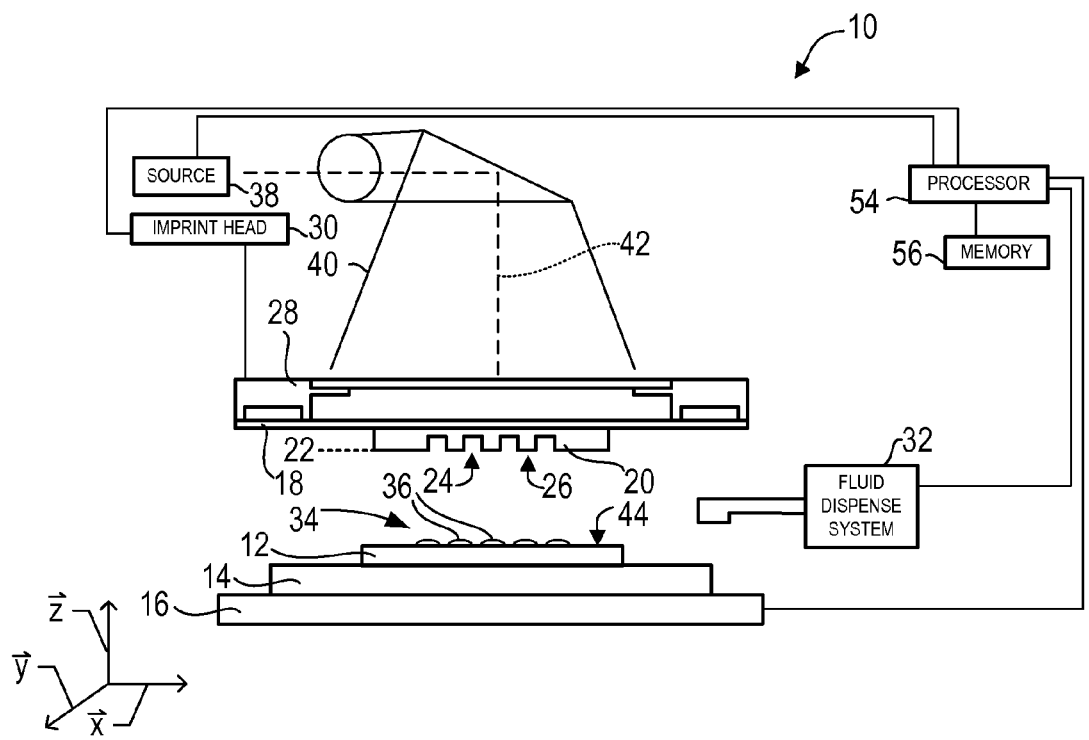
FIG. 1 illustrates a simplified side view of an embodiment of a lithographic system.

Referring to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown). Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, inorganic materials, organic materials, or combinations thereof, including fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Substrate 12 may include one or more layers (e.g., an adhesion layer) solidified on the substrate. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Application Publication No. 2005/0187339, all of which are hereby incorporated by reference herein.

Figure 2:
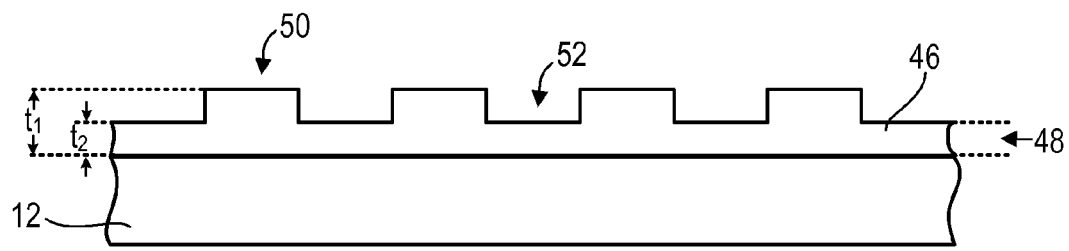
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to a shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having a thickness t1 and residual layer 48 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

Figure 3:
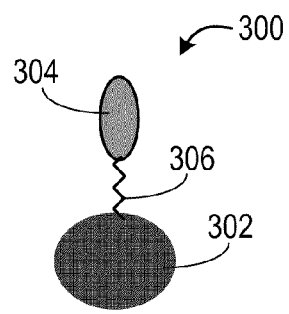
FIG. 3 is an illustration of a fluorinated surfactant.

To promote release of the patterned layer 46 from the patterning surface 22 in nano-imprint lithography processes such as those described above, one or more surfactants may be added to the polymerizable material. In some cases, a surfactant or surfactant-containing composition may be applied to patterning surface 22 of template 18 before the patterning surface contacts the polymerizable material. The surfactant may improve release of the patterned layer 46 from the patterning surface 22. In some embodiments, as depicted in FIG. 3, the surfactant 300 may include a fluorinated non-polar end 302 and a polar end 304 coupled by a linking group 306.

Some templates 18 made of substantially inorganic material (e.g., quartz, fused silica, and the like), have naturally occurring hydroxyl groups (—OH) on the patterning surface. For a silicon-containing patterning surface or template, the hydroxyl groups may be connected to silicon atoms on the surface of the patterning surface or template to form silanol groups, —SiOH. The number or density of hydroxyl groups on a substantially inorganic patterning surface 22 may increase after the patterning surface is cleaned, for example, with a wet sulfuric acid peroxide mixture (SPM) or plasma dry cleaning. In some embodiments, after cleaning, the patterning surface 22 may be fully populated or substantially covered with hydroxyl groups, as illustrated in FIG. 4.

Figure 4:
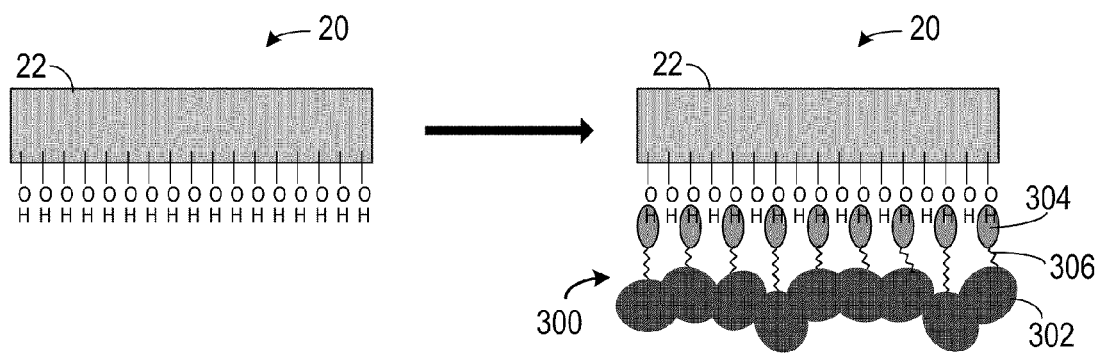
FIG. 4 is an illustration of a template surface populated with hydroxyl groups.

When a surfactant 300 approaches patterning surface 22, the polar end 304 of the surfactant 300 may interact with the patterning surface as illustrated in FIG. 4. That is, surfactant 300 may interact (e.g., form non-covalent bonds, such as hydrogen bonds) with the hydroxyl groups on the patterning surface 22, such that the patterning surface anchors the polar end of the surfactant, and the fluorinated non-polar end 302 is directed away from the patterning surface (e.g., toward the air or ambient gas).

While hydroxyl groups on the patterning surface 22 serve to anchor the surfactant 300 through interactions such as hydrogen bonding, hydroxyl groups on the patterning surface also tend to grab and accumulate surfactant as the number of imprints increases in an imprint lithography process. The rate or extent of surfactant accumulation or build-up may be influenced by the number or density of hydroxyl groups on a patterning surface. In some embodiments, the build-up of surfactant at the patterning surface 22 may reduce the fluid filling speed proximate locations of high surfactant concentration on the patterning surface 22.

In some embodiments, when the number or density of hydroxyl groups on the patterning surface is reduced (e.g., when a pre-selected percentage of hydroxyl groups on the surface are replaced by less reactive or less polar groups), substantially defect-free patterned layers may be fabricated without a decrease in filling speed that may be attributed to the accumulation of surfactant on the patterning surface. Thus, selectively treating the patterning surface before imprinting may promote high throughput in a nano-imprint lithography process, while allowing excellent release performance. Selectively treated patterning surfaces may also require less frequent cleaning, resulting in less equipment downtime.

Figure 5:
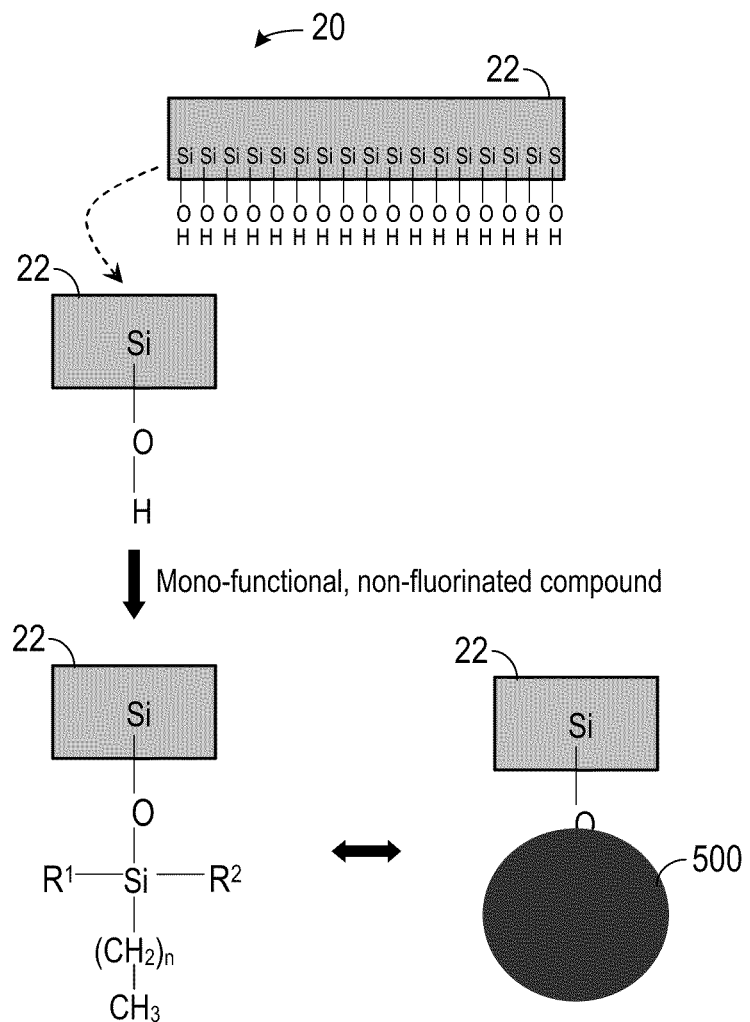
FIG. 5 is an illustration of a hydroxyl group on a template surface reacting with a mono-functional, non-fluorinated compound to attach a non-fluorinated group at the template surface.

In one embodiment, some of the hydroxyl groups on a patterning surface may react with (e.g., undergo a condensation reaction with) a substance, such that some of the hydroxyl groups on the surface are replaced with groups that do not interact, or interact less strongly than hydroxyl, with a polar end of a surfactant. For example, as illustrated in FIG. 5, a hydroxyl group on patterning surface 22 bonded to, for example, silicon atoms on the surface denoted by Si, reacts with a mono-functional, non fluorinated compound in a condensation reaction (e.g., $CH_3(CH_2)_nR^1R^2Si$—X, where n ranges from 0 to 16, inclusive, in which $R^1$ and $R^2$ may be the same or different groups and may be alkyl groups, such as, for example, $CH_3$. The hydrogen in the hydroxyl group is effectively replaced by a silicon-containing, non-fluorinated group 500. For n=0 and $R^1$=$R^1$=$CH_3$, group 500 is a trimethylsilyl group, considered to be substantially spherical in shape, as illustrated in FIG. 5.

Figure 6:
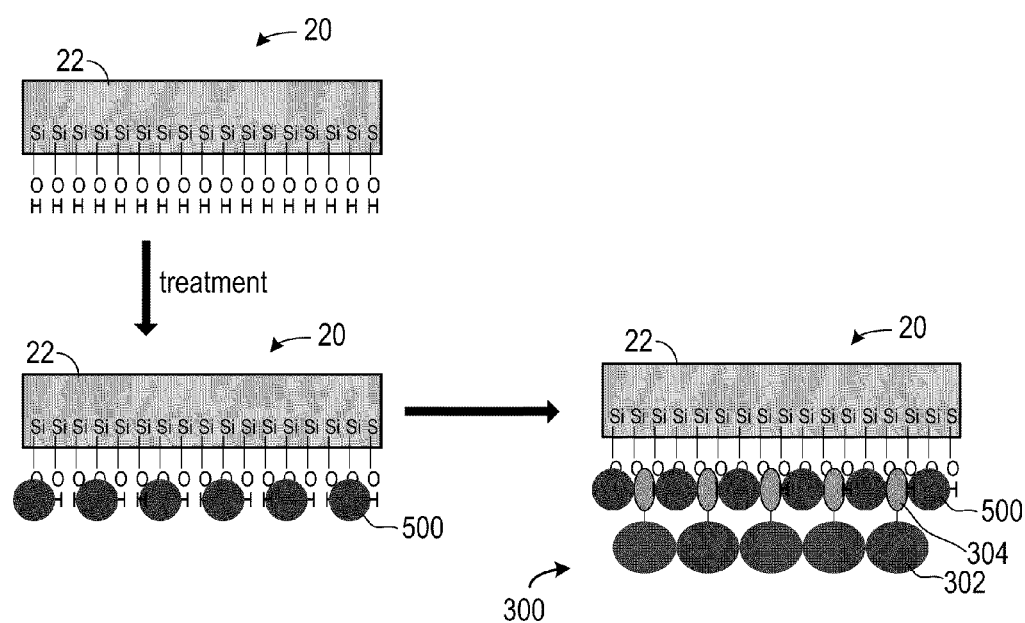
FIG. 6 is an illustration of a process including treating a template surface with a mono-functional, non-fluorinated compound and contacting the treated surface with a surfactant-containing composition.

In the process illustrated in FIG. 6, a precursor (e.g., HMDS) decomposes (e.g., in the presence of heat) to form a mono-functional, non-fluorinated silane (e.g., trimethylsilyl), which reacts with the surface hydroxyl groups. After the mono-functional silane has reacted with the surface hydroxyl group, there are no remaining reactive groups on the silane. That is, the mono-functional silane and the coating formed therefrom are substantially unreactive, such that the mono-functional silane is unable to polymerize (e.g., unable to bond together to form oligomers or monomers), and a silicon-containing, non-fluorinated monolayer with a thickness of about 1 nm or less or about 2 nm or less is formed on the patterning surface. The unreactive nature of the monolayer inhibits the formation of a networked layer, matrix, or multi-layer coating on the patterning surface or on the monolayer. Thus, patterning surfaces with fine features (e.g., on the order of nanometers) may be successfully reproduced without dimensional distortion caused by a thicker coating.

Although HMDS is known in the art as an adhesion promoter—and not a release agent—it was found unexpectedly and surprisingly that a trimethylsilyl monolayer formed from HMDS on a patterning surface, with a monolayer thickness of about 1 nm, does not compromise template release performance. In fact, the trimethylsilyl monolayer formed on the patterning surface through decomposition of HMDS and binding of trimethylsilyl groups to the surface at a pre-selected percentage of sites reduces adhesion between the patterning surface and the polymerizable or polymerized material. That is, with fewer hydroxyl groups present on the template surface to interact with the polymerized material, there is less friction and lower adhesion between the patterning surface and the polymerized material. The reduced friction, which may be attributed to the generally spherical nature of trimethylsilyl groups, may be achieved without an increase in surfactant interactions on the patterning surface. Furthermore, the trimethylsilyl monolayer controls the percentage of hydroxyl groups on the patterning surface by replacing a pre-selected percentage of the hydroxyl groups with trimethylsilyl groups without the need to use fluorinated or siloxane-containing compounds. That is, a selected amount of mono-functional, non-fluorinated compound may be reacted with a patterning surface to replace a pre-selected percentage of hydroxyl groups on the patterning surface to form a monolayer coating on the surface of the template.

The percentage of hydroxyl groups on the patterning surface to be replaced with silicon-containing, non-fluorinated groups (e.g., trimethylsilyl groups) may be pre-selected in a range, for example, from about 5% to about 90%, or from about 20% to about 70%. In certain embodiments, the percentage of hydroxyl groups on the patterning surface to be replaced with silicon-containing, non-fluorinated groups (e.g., trimethylsilyl groups) may be pre-selected in a range from about 30% to about 60%, or from about 40% to about 50%.

In some embodiments, as depicted in FIG. 6, about half of the hydroxyl groups may be replaced with silicon-containing, non-fluorinated groups 500. When patterning surface 22 is treated with a surfactant or surfactant-containing composition, fewer hydroxyl groups are available to interact with the surfactant. That is, the number or percentage of hydroxyl groups on the surface of the template and available to interact with surfactant has been controlled (e.g., modulated) by attaching silicon-containing, non-fluorinated groups such as trimethylsilyl groups to the patterning surface. Thus, the surfactant density at the patterning surface 22 as shown in FIG. 6 is less than the surfactant density at the patterning surface as shown in FIG. 4. With fewer sites available to interact with the surfactant, surfactant is less likely to accumulate on the patterning surface. As such, surface treatment to reduce the number of hydroxyl groups on a patterning surface may improve throughput and reduce the frequency of cleaning of a patterning surface in a nano-imprint lithography process.

A surfactant or surfactant-containing composition may be applied to the patterning surface independently of (e.g., before or after) the patterning surface is contacted with polymerizable composition used to form a patterned layer. In some embodiments, reducing the number of hydroxyl groups on a patterning surface may allow a reduction in the amount of surfactant (e.g., in a surfactant-containing composition or polymerizable composition) needed to achieve substantially defect-free release of a patterned layer from a patterning surface. For example, in some cases, excellent release performance may be achieved with a nano-imprint lithography template treated to reduce the number of surface hydroxyl groups to a pre-selected percentage of hydroxyl groups in combination with a polymerizable composition including at most about 0.3 wt % surfactant, at most about 0.2 wt % surfactant, or at most about 0.1 wt % surfactant.

A reduction in the amount of surfactant in the polymerizable composition may reduce surfactant build-up on the patterning surface and may reduce adverse effects of surfactant build-up on throughput in nano-imprint lithography processes. In certain embodiments, reducing the number of hydroxyl groups on a patterning surface may allow substantially defect-free release of a patterned layer from a patterning surface to be achieved without the use of surfactant in the polymerizable composition.

Monolayer coatings described herein differ from some template coatings in several ways. First, the groups that form the non-fluorinated monolayer described herein do not crosslink or bond together or with other compounds to form a polymerized or networked coating. The unreactive nature of the groups that form this monolayer inhibit formation of additional layers or multi-layer coatings. Second, the groups that form the non-fluorinated monolayer described herein are robust and substantially self-repairing. For example, a trimethyl or trimethylsilyl group bonded to the surface of a template may be cleaved from the surface. The surface may then react with moisture such that the trimethyl or trimethylsilyl group is effectively replaced with a hydroxyl group. The new hydroxyl group may then interact with surfactant contacted with the template (e.g., a surfactant-containing solution, a surfactant-containing polymerizable composition, etc.) such that the template surface is coated with surfactant. In this case, "hot spots," or spots that cause adhesion of the polymerized material to the template, are avoided or reduced, and the release performance of the template is substantially maintained over time. In contrast, template coatings known in the art of nano-imprint lithography, which include long-chain fluorinated groups bonded to the surface, tend to lose effectiveness as the long-chain groups are severed between carbon-carbon bonds, leaving a less effective coating with non-reactive pendant groups, and substantially no possibility for repair.

EXAMPLE

In an example, a patterning surface was treated with HMDS to form a trimethylsilyl monolayer by the following process. A nitrogen bubbler was used to carry HMDS vapor with a nitrogen flow rate of 55 mL/min. The HMDS vapor was passed through a fine filter to remove particles, and then introduced into a reaction chamber heated to 100° C. The template, which had been pre-baked at 120° C. for 2 hours in a separate oven to effect dehydration, was introduced to the reaction chamber and exposed to the HMDS vapor for 7.5 minutes.

Table 1 lists the components in parts per weight of comparative polymerizable composition M1 and polymerizable compositions M2 and M3.

TABLE 1

| Component | M1 | M2 | M3 |
|---|---|---|---|
| Isobornyl acrylate | 56 | 56 | 56 |
| MEDOL 10 | 19 | 19 | 19 |
| 1,6-hexanediol diacrylate | 20 | 20 | 20 |
| IRGACURE ® 907 | 1 | 1 | 1 |
| DAROCUR ® 4265 | 4 | 4 | 4 |
| MASURF ® FS-2000 | 1 | 0.1 | 0 |

Isobornyl acrylate (IBOA), shown below, is available from Sartomer Company, Inc. of Exton, Pa. as SR506A.

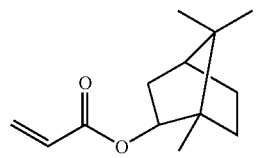

MEDOL 10, shown below, is (2-ethyl-2-methyl-1,3-dioxolan-4-yl) methyl acrylate, available from Osaka Organic Chemical in Japan.

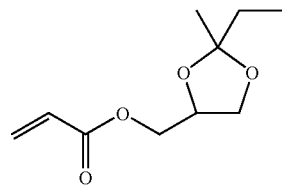

1,6-hexanediol diacrylate (HDODA), shown below, is available from Cytec Surface Specialties, Inc. in Smyrna, Ga.

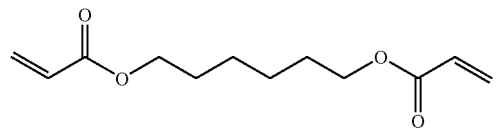 [SMILES: C=CC(=O)OCCCCCCOC(=O)C=C]

IRGACURE® 907, shown below, is a photoinitiator (2-methyl-1[4-(methylthio)-phenyl]-2-morpholinopropan-1-one), available from Ciba Specialty Chemicals in Switzerland.

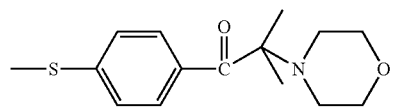

DAROCUR® 4265 is a 1:1 photoinitiator mixture of is 2,4,6-trimethylbenzoyldiphenylphosphineoxide (TPO) and 2-hydroxy-2-methyl-1-phenyl-propan-1-one, available from Ciba Specialty Chemicals. TPO, shown below, is a photoinitiator available from BASF in Freeport, Tex.

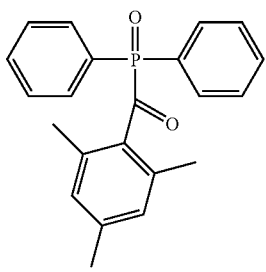 [SMILES: Cc1cc(C)c(C(=O)P(=O)(c2ccccc2)c2ccccc2)c(C)c1]

The structure of 2-hydroxy-2-methyl-1-phenyl-propan-1-one is shown below.

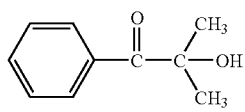

MASURF® FS-2000 is fluorinated surfactant available from Mason Chemical Company in Arlington Heights, Ill.

Comparative polymerizable composition M1 includes about 1 wt % MASURF® FS-2000. Polymerizable composition M2 includes about 0.1% wt % MASURF® FS-2000. Polymerizable composition M3 does not include a surfactant.

Comparative polymerizable composition M1 was evaluated in conjunction with a patterning surface that had not been treated with HMDS. The contact angle of comparative polymerizable composition M1 on a surfactant-rich (non-HMDS-treated) patterning surface was measured as 18.8°.

Polymerizable composition M2 was evaluated in conjunction with a patterning surface that had been treated with HMDS as described above. The contact angle of polymerizable composition M2 on a HMDS-treated patterning surface was measured as 13.0°. The reduced contact angle, compared to that of M1 on a more surfactant-rich (and non-HMDS-treated) patterning surface indicates that an improved filling speed may be achieved with the use of a HMDS-treated template along with a reduction in surfactant concentration. Patterned layers formed with polymerizable composition M2 and HMDS-treated patterning surfaces with 32 nm lines and spaces (1:1 dense gratings) displayed fine dense features, with feature fidelity comparable to that of comparative polymerizable composition M1 on a more surfactant-rich (and non-HMDS-treated) patterning surface.

Polymerizable composition M3 was evaluated in conjunction with a patterning surface that had been treated with HMDS as described above, and a substrate with an adhesion layer. The adhesion layer composition, described in U.S. Patent Application Publication No. 2007/0021520 as Composition 3, includes a combination of approximately 77 grams ISORAD™ 501 (a carboxy-functional, acrylated o-cresol epoxy novolac oligomer available from Schenectady International, Inc., Schenectady, N.Y.), 22 grams CYMEL® 303ULF (available from Cytec Industries Inc.), and 1 gram CYCAT® 4040 (available from Cytec Industries Inc.) introduced into approximately 1900 grams of PM Acetate (propylene glycol monomethyl ether acetate, or 2-(1-methoxy)propyl acetate, available from Eastman Chemical Co., Kingsport, Tenn.).

A nano-imprint lithography process was used to form a patterned layer from polymerizable composition M3 on a substrate coated with an adhesion layer formed from the composition described above. Adhesion between the patterned layer and the adhesion layer was measured to be about $2.4 \times 10^5$ Pa, while the adhesion between the patterned layer and the HMDS-treated patterning surface was measured to be about $1.4 \times 10^4$ Pa. Thus, preferential adhesion was achieved in the absence of a traditional release layer, release agent, or combination thereof on the patterning surface. As used herein, "preferential adhesion" is achieved when adhesion between the substrate and the patterned layer exceeds the adhesion between the patterned layer and the patterning surface.

The embodiments of the present invention described above are exemplary. Many changes and modifications may be made to the disclosure recited above, while remaining within the scope of the invention. Therefore, the scope of the invention should not be limited by the above description, but instead should be determined with reference to any appended claims along with their full scope of equivalents.

What is claimed is:

1. A method comprising:
   forming a multiplicity of hydroxyl groups on a surface of a substantially inorganic nano-imprint lithography template, wherein the hydroxyl groups are covalently bonded to atoms on the surface of the template;
   decomposing hexamethyldisilazane, and reacting about 20% to about 70% of the hydroxyl groups on the surface of the template with the decomposed hexamethyldisilazane to form a monolayer coating of trimethylsilyl groups on the surface of the nano-imprint lithography template, thereby yielding a coated nano-imprint lithography template comprising unreacted hydroxyl groups on the surface of the coated nano-imprint lithography template; and
   contacting the surface of the coated nano-imprint lithography template with a surfactant comprising a polar end and a fluorinated non-polar end, thereby forming non-covalent interactions between the polar end of the surfactant and at least some of the unreacted hydroxyl groups on the surface of the coated nano-imprint lithography template.

2. The method of claim 1, wherein the nano-imprint lithography template comprises silicon, and the hydroxyl groups are bonded to silicon atoms on the surface of the nano-imprint lithography template.

3. The method of claim 1, wherein the monolayer is not crosslinked.

4. The method of claim 1, wherein about 30% to about 60% of the hydroxyl groups on the surface of the template are reacted with the decomposed hexamethyldisilazane to form the monolayer coating on the surface of the nano-imprint lithography template.

5. The method of claim 1, wherein contacting the surface of the coated nano-imprint lithography template with a the surfactant comprises contacting the surface of the coated nano-imprint lithography template with a polymerizable composition comprising the surfactant, wherein the polymerizable composition comprises at most about 0.3 wt % of the surfactant.

6. The method of claim 1, wherein severed bonds in the monolayer coating react with moisture in situ to form additional hydroxyl groups on the surface of the template, and the additional hydroxyl groups interact with the surfactant to form non-covalent interactions between the polar end of the surfactant and the additional hydroxyl groups.

7. The method of claim 1, further comprising contacting the coated nano-imprint lithography template with a polymerizable composition, wherein the polymerizable composition is substantially free of surfactant.

8. The method of claim 1, wherein the monolayer coating is about 1 nm thick or less.

9. The method of claim 1, further comprising heating the template after forming the multiplicity of hydroxyl groups on the surface of the substantially inorganic nano-imprint lithography template.

10. A method comprising:
forming a multiplicity of hydroxyl groups on a surface of a substantially inorganic nano-imprint lithography template, wherein the hydroxyl groups are covalently bonded to atoms on the surface of the template;
decomposing hexamethyldisilazane, and reacting about 20% to about 70% of the hydroxyl groups on the surface of the template with the decomposed hexamethyldisilazane to form a monolayer coating of trimethylsilyl groups on the surface of the nano-imprint lithography template, thereby yielding a coated nano-imprint lithography template comprising unreacted hydroxyl groups on the surface of the coated nano-imprint lithography template; and
contacting the surface of the coated nano-imprint lithography template with a first polymerizable composition comprising a surfactant having a polar end and a fluorinated non-polar end, thereby forming non-covalent interactions between the polar end of the surfactant and at least some of the unreacted hydroxyl groups on the surface of the coated nano-imprint lithography template,
wherein the contact angle of the first polymerizable composition on the surface of the coated nano-imprint lithography template is at least 5° less than the contact angle of a second polymerizable composition on the surface of an uncoated nano-imprint lithography template, wherein the second polymerizable composition has a surfactant content about 10 times greater than the surfactant content of the first polymerizable composition.

11. The method of claim 10, wherein the nano-imprint lithography template comprises silicon, and the hydroxyl groups are bonded to silicon atoms on the surface of the nano-imprint lithography template.

12. The method of claim 10, wherein about 30% to about 70% of the hydroxyl groups on the surface of the template are reacted with the decomposed hexamethyldisilazane to form the monolayer coating on the surface of the nano-imprint lithography template.

* * * * *